United States Patent [19]
Fisher et al.

[11] Patent Number: 5,757,623
[45] Date of Patent: May 26, 1998

[54] LOW-NOISE, HIGH-Q STRIPLINE INDUCTOR

[75] Inventors: Rayette Ann Fisher; William Andrew Hennessy, both of Schenectady, N.Y.

[73] Assignee: General Electric Company, Schenectady, N.Y.

[21] Appl. No.: 774,545

[22] Filed: Dec. 30, 1996

[51] Int. Cl.$^6$ .............. H05K 1/02; H05K 7/06; H01F 27/34; H01F 21/00
[52] U.S. Cl. .............. 361/821; 361/782; 333/185; 336/223; 336/200
[58] Field of Search .............. 361/763, 766, 361/782, 811, 818, 821; 333/175, 181, 185, 202, 204; 336/181, 199, 200, 223, 232; 174/34, 36, 261

[56] References Cited

U.S. PATENT DOCUMENTS

| | | | |
|---|---|---|---|
| 2,188,651 | 1/1940 | Cox | 336/200 |
| 5,161,093 | 11/1992 | Gorczyca et al. | 361/795 |
| 5,270,656 | 12/1993 | Roberts et al. | 336/232 |
| 5,446,311 | 8/1995 | Ewen et al. | 336/223 |
| 5,450,755 | 9/1995 | Saito et al. | 336/200 |

*Primary Examiner*—Leo P. Picard
*Assistant Examiner*—John B. Vigushin
*Attorney, Agent, or Firm*—Jill M. Breedlove; Douglas E. Stoner

[57] ABSTRACT

A low-value, low-noise, high-Q, high-tolerance inductor is fabricated using multichip module technology, such as high density interconnect (HDI) technology. The inductor has overlapping sections of conductors which contain high magnetic fields between them to reduce the amount of radiated energy and circuit shielding required. The spacing between conductor sections of the inductor is adjustable in order to provide a predetermined amount of field cancellation and thereby achieve a specific inductance value. The inductor shape provides uniformity of current density across the conductor cross section, thus maximizing the Q value of the inductor.

8 Claims, 3 Drawing Sheets

LOW-NOISE, HIGH-Q STRIPLINE INDUCTOR

This invention was made with Government support under Government Contract No. F33615-91-C-1776 awarded by the Air Force. The Government has certain rights to this invention.

FIELD OF THE INVENTION

The present invention relates generally to inductors and, more particularly, to a low-value, low-noise, high-tolerance inductor for applications in multichip module technologies.

BACKGROUND OF THE INVENTION

Radio frequency (RF) power circuit designs often require stripline inductors having values in the 1 to 100 nH range. Such inductors typically carry amperes of current and create RF fields which interfere with nearby electrical components. Electromagnetic interference (EMI) shielding is thus required which adds weight and cost to the RF circuit. In addition, the tolerance of a low-value inductor is poor because its dimensions are typically near the dimensional tolerances of manufacturing using conventional etching processes. Indeed, an optimal design must frequently be redesigned non-optimally with respect to circuit efficiency and size in order to increase the inductor size for improved fabrication tolerance.

Accordingly, it is desirable to provide a low-value, low-noise, high-tolerance inductor suitable for multichip module technologies, such as high density interconnect (HDI) technology. Furthermore, it is desirable to have the capability to optimize inductor size for particular applications by adjusting height as well as footprint, i.e., surface area.

SUMMARY OF THE INVENTION

A low-value, low-noise, high-Q, high-tolerance inductor according to the present invention is fabricated using multichip module technologies, such as high density interconnect (HDI) technology. The low-value inductor has overlapping sections of conductors which contain high magnetic fields between them and reduce the amount of radiated energy and circuit shielding required. The spacing between conductor sections of the inductor is readily adjustable in order to provide a predetermined amount of field cancellation and thereby achieve a predetermined inductance value. The spacing is provided by making pockets in the HDI substrate, metallizing the bottom of the pockets, and then using a spacer with desired resistive, dielectric or magnetic properties to physically support an upper layer of metal. The inductor shape provides uniformity of current density across the conductor cross section, thus maximizing the quality factor (Q) value of the inductor.

BRIEF DESCRIPTION OF THE DRAWINGS

The features and advantages of the present invention will become apparent from the following detailed description of the invention when read with the accompanying drawings in which:

FIG. 3b schematically illustrates the distributed filter network of FIG. 3a.

DETAILED DESCRIPTION OF THE INVENTION

Figure 1:
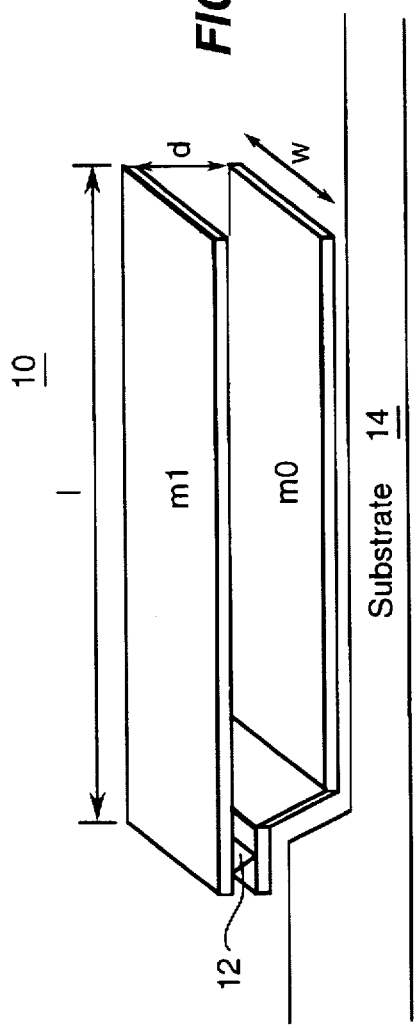
FIG. 1 is a perspective view illustrating a high-tolerance, low-value stripline inductor according to the present invention.

FIG. 1 illustrates the construction of an inductor 10 in a multichip module technology (e.g., HDI) in accordance with the present invention.

HDI structures are described in U.S. Pat. No. 5,161,093 of Gorczyca et al., issued Nov. 3, 1992. An HDI structure comprises a ceramic substrate, such as alumina, which may be on the order of 100 mils thick, onto which semiconductor chips are deposited in a cavity (or cavities) and interconnected. HDI cavities are prepared using, for example, ultrasonic or laser milling. A thermoplastic adhesive layer, such as a polyetherimide resin available from General Electric Company under the trade name ULTEM 6000 is deposited on the bottom of the cavity (or cavities). The various components are placed in their desired locations within the cavity (or cavities), and the structure is heated to about 300° C., i.e., above the softening point of the adhesive, and then cooled to thermoplastically bond the individual components to the substrate. For power HDI circuits components which have backside metallization are soldered to the first metal (metal-0) layer. Thereafter, a polyimide film, such as that sold under the trade name Kaptbn by E. I. du Pont de Nemours and Company, is laminated across the top of the chips. Vias are provided such as by laser drilling, and a metallization layer is deposited over the polyimide film which extends into the vias and makes electrical contact to the contact pads on the electronic components. The metallization layer may be patterned to form individual conductors during its deposition, or it may be deposited as a continuous layer and then patterned using photoresist and etching. Additional dielectric and metallization layers are provided as required in order to provide all of the desired electrical connections among the chips.

As illustrated in FIG. 1, inductor 10 comprises a loop of metal-1 (m1) overlying metal-0 (m0) deposited on an HDI substrate 14. Metal-1 and metal-0 may comprise copper, for example. Multiple via interconnections 12 are provided in a row (only the foremost of which is visible in FIG. 1) between metal-1 and metal-0 at the left of FIG. 1. Inductor length is represented as l, HDI substrate well depth is represented by d, and the width of the inductor is represented by w. In an exemplary inductor structure according to the present invention, l=0.36 inches, d=0.035 inches, and w=0.125 inches.

In the structure of FIG. 1, inductor current flows in opposite directions in metal-1 and metal-0. As a result, there is a predetermined amount of EMI field cancellation, depending on the separation of metal-1 and metal-0. This field cancellation allows for a desired low value of inductance (e.g., in the tenths of nanohenries).

Advantageously, the illustrated inductor shape provides uniformity of current density across the conductor cross section, thus maximizing the quality factor (Q) value of the inductor. (In contrast, in prior art circuits, current crowds toward the center of the structure which is the path of least resistance, minimizing the Q value of the inductor.)

Figure 2:
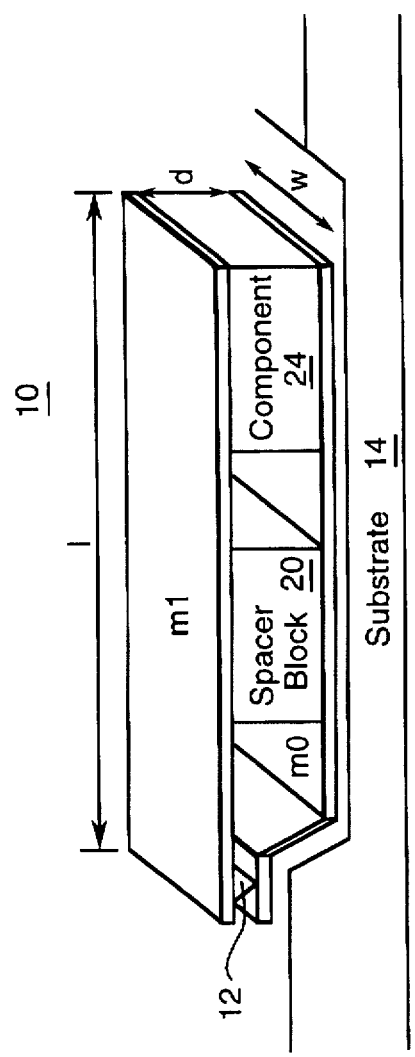
FIG. 2 illustrates an exemplary low-inductance connection between an electrical circuit component and a low-value stripline inductor in accordance with the present invention.

FIG. 2 illustrates an example of a low-value inductance connection between an electrical circuit component 20 and a low-value stripline inductor in accordance with the present invention. In this example, the inductor requires a length l which is greater than the allowed distance for unsupported upper layers in HDI (e.g., greater than 0.040 inches ). The space d between the metal layers (i.e., metal-0 and metal-1) is provided by making wells, or pockets, in the HDI substrate in well-known manner, metallizing the bottom surfaces of the pockets, and then using a spacer to physically support an upper layer of metal.

In FIG. 2, a non-conductive spacer block 24 is placed between metal-0 and metal-1 with a height equal to the substrate well depth d. Exemplary spacers may comprise a high resistance silicon chip or a block of HDI substrate material, such as alumina. The selected spacer material must be substantially unaffected by the highest temperature of processing. Metal-0 of the inductor is solder-connected to the bottom side of component 20. Metal-1 of the inductor is solder-connected to the top of component 20. This low value inductor is effectively in parallel with component 20. Currents flow in opposite directions in metal-1 and metal-0, resulting in a predetermined amount of field cancellation which depends on the well depth d.

The inductance due to the metal-1 and metal-0 connection with the row of vias 12, at the left in FIG. 2, is negligible because of the small dimensions of the vias (e.g., on the order of 0.001 inches ), their multiplicity, and the field cancellation. The inductance contribution of metal-0 rising up the edge of the well to the top of the substrate contributes minimally to the inductance and can be calculated. The inductance is specified by adjusting the well depth d and the length l and width w of the metal-1 and metal-0 traces. Dimensional control is easily reproducible as a result of the high precision HDI processes. For exemplary inductors constructed according to the present invention, inductance variation is less than 5%.

EXAMPLE

A stripline inductor such as that illustrated in FIGS. 1 and 2 was developed according to the present invention. A high resistance silicon chip was used as a spacer between the conductive layers.

For this example, the calculation of inductance L is based on the length l, the thickness of the conductors t, the width of the conductor w and the spacing between the plates d. In this example, w=3.15 mm, t=10 μm, d=35 mils=0.889 mm. An equation for the inductance of a return circuit of parallel conductors for the particular case of rectangular conductors is given as:

$$L=0.004l[\log_e\{dl(w+t)\}+1.5 +(\log_e\{k\}-\log_e\{e\})].$$

For this example, $\log_e\{k\}=0.5774$ and $\log_e\{e\}\sim 0$.

A preferred structure was calculated using this methodology to yield L=2.95 nH. Then, the structure was simulated including the HDI end-connect where the two parallel conductors have to be brought to the alumina substrate for multiple via interconnect. (See the left portion of FIG. 1.) The interconnect reduced the inductance from 2.95 nH (calculated) to 2.47 nH (simulated), i.e., a 16.3% reduction. The reduction is due to the fact that the conductors get closer together as the metal-0 layer extends out of the well. The equal and opposite currents as the conductors get closer together result in more field cancellation; the effect is a lower inductance.

As actually constructed, the inductance measured 2.5 nH on an impedance analyzer. In order to compensate for the HDI interconnect at the end, the structure could be made longer (i.e., increased l), and/or the well could have been made deeper (i.e., increased d for less cancellation).

Advantageously, stripline inductors using well depth to determine inductance in any high frequency circuit in accordance with the present invention may have a distributed inductance value over an arbitrary number of circuit components.

Figure 3B:
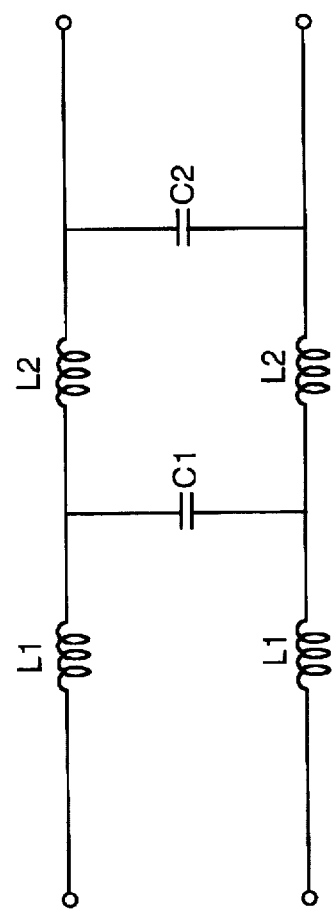
Figure 3A:
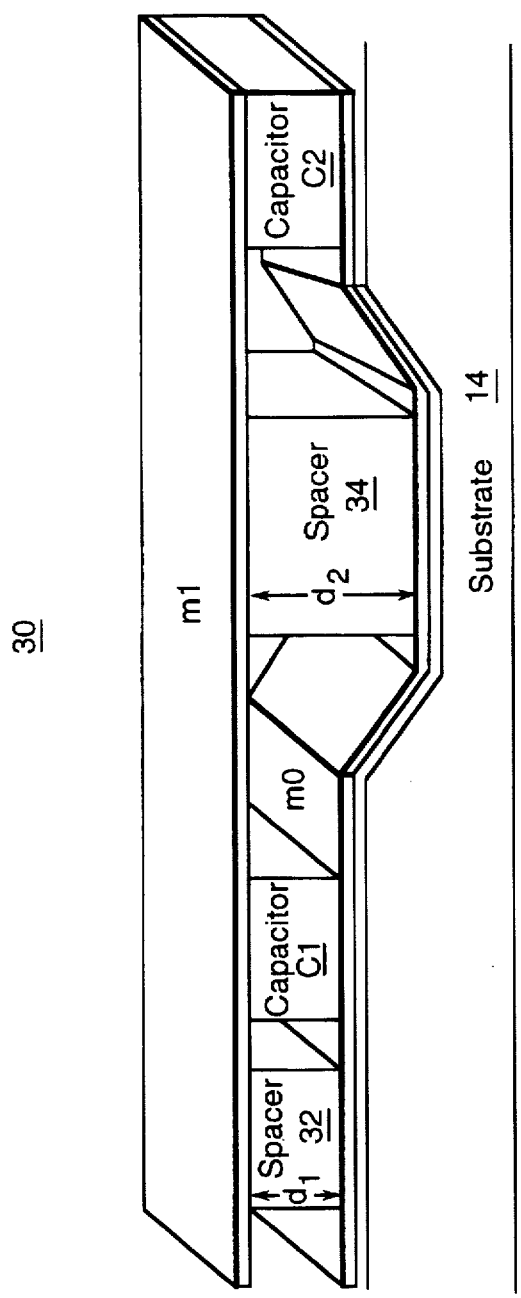
FIG. 3a illustrates a distributed filter network in accordance with the present invention.

FIG. 3a illustrates a distributed filter network 30 constructed in accordance with the present invention. FIG. 3b schematically illustrates the distributed filter network of FIG. 3a. As illustrated, the well depth d1 provided using spacer 32, which is used to create the inductance value L1, differs from the well depth d2 provided using spacer 34, which is used to create the inductance value L2. Capacitors C1 and C2 are provided using suitable dielectric materials to create the desired respective capacitance values. Advantageously, therefore, low-noise distributed filter networks having differing inductance values may be constructed using HDI technology in accordance with the present invention by suitably varying the well depth along the length of the stripline inductor.

Figure 4:
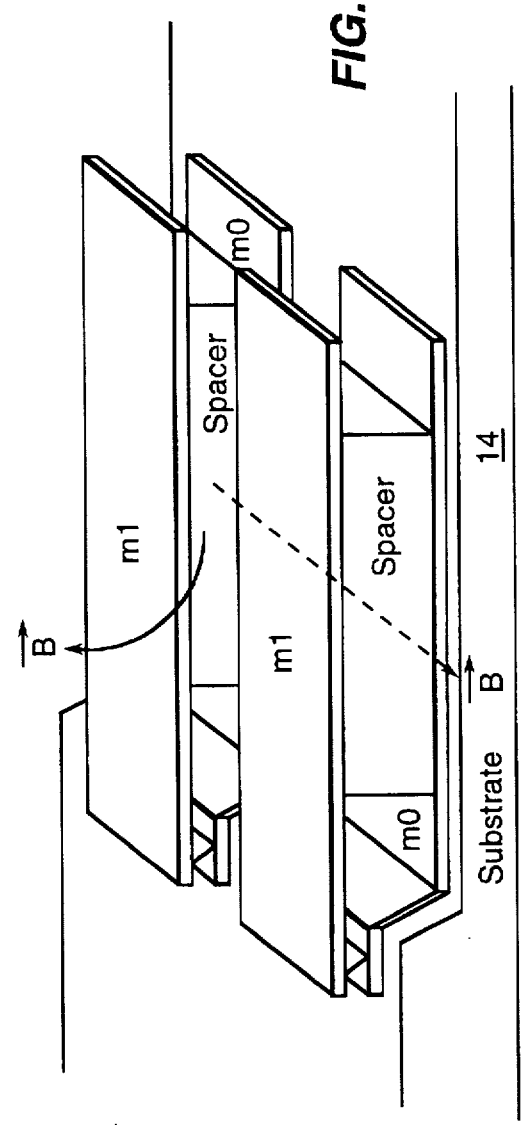
FIG. 4 illustrates two coupled HDI stripline inductors in accordance with the present invention.

FIG. 4 illustrates another aspect of the present invention wherein two stripline inductors 40 and 50 are situated side-by-side in an HDI substrate 14, each having a suitable spacer 42 and 52, respectively, situated between its respective metal layers m1 and m0. (Alternatively, a single space could span both structures and could be magnetic for tighter coupling.) The arrows in FIG. 4 represent the direction of the magnetic fields which, in this side-by-side configuration, allow for a predetermined coupling in a low-noise configuration.

A low value stripline inductor constructed in accordance with the present invention would be useful in high frequency microwave, power, and signal applications. For example, such inductors would be useful as tuning elements for high frequency amplifiers (e.g., 10 MHz and above) and as power inductors in higher frequency power conversion applications.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. An inductor, comprising:

a first metal layer deposited on a multichip module substrate;

a second metal layer overlying the first metal layer with a space therebetween having a predetermined depth, the first and second metal layers having a predetermined length and a predetermined width and being electrically connected together, the space comprising spacer components having predetermined electrical characteristics; and the depth, length, and width determining the inductance value of the inductor.

2. The inductor of claim 1, comprising an HDI structure, the multichip module substrate comprising an HDI substrate, the space comprising a well in the HDI substrate having a metallization layer deposited thereon.

3. The inductor of claim 2, comprising vias for connecting the first and second metal layers at one end of the inductor.

4. The inductor of claim 1 wherein the inductance value thereof is distributed over a plurality of circuit components.

5. The inductor of claim 4 wherein the distance between the first metal layer and the second metal layer varies along the length of the inductor.

6. A distributed filter network comprising a plurality of inductors and at least one capacitor or resistor, comprising:
- a stripline inductor structure comprising a first metal layer deposited on a multichip module substrate;
- a second metal layer overlying the first metal layer with spacers therebetween, the spacers determining distance between the first metal layer and the second metal layer which varies along the length of the stripline inductor structure depending on predetermined inductance values of the inductors; and
- at least one dielectric or resistive material situated between the first and second metal layers to provide a predetermined capacitance or resistance value for the at least one capacitor or resistor.

7. The distributed filter network of claim 6, comprising an HDI structure, the multichip module substrate comprising an HDI substrate, the spacers being situated in a well in the HDI substrate having a metallization layer deposited thereon.

8. At least two coupled stripline inductors, each comprising:
- a first metal layer;
- a second metal layer overlying the first metal layer with a space therebetween having a predetermined depth, the first and second metal layers having a predetermined length and a predetermined width and being electrically connected together, the space comprising spacer components having predetermined electrical characteristics; and
- the depth, length, and width determining the inductance value of the respective inductor;
- the at least two stripline inductors being situated side-by-side in an HDI structure such that the first metal layer of each is deposited on an HDI substrate, the space comprising a well in the HDI substrate having a metallization layer deposited thereon.

* * * * *